United States Patent
Lee et al.

(10) Patent No.: US 7,989,335 B2
(45) Date of Patent: Aug. 2, 2011

(54) METHODS OF FORMING INSULATION LAYER PATTERNS AND METHODS OF MANUFACTURING SEMICONDUCTOR DEVICES INCLUDING INSULATION LAYER PATTERNS

(75) Inventors: Kyoung-Woo Lee, Hwaseong-si (KR); Hong-Jae Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/661,885

(22) Filed: Mar. 25, 2010

(65) Prior Publication Data

US 2010/0248436 A1     Sep. 30, 2010

(30) Foreign Application Priority Data

Mar. 26, 2009   (KR) .................. 10-2009-0025658

(51) Int. Cl.
*H01L 21/44* (2006.01)

(52) U.S. Cl. ......... 438/597; 257/E21.507; 257/E21.627; 257/E21.658; 438/233; 438/586; 438/618

(58) Field of Classification Search ........... 257/E21.507, 257/E21.627, E21.658; 438/233, 586, 597, 438/618

See application file for complete search history.

(56) References Cited

FOREIGN PATENT DOCUMENTS

| JP | 10-294367 A | 11/1998 |
|---|---|---|
| KR | 10-2007-0071659 A | 7/2007 |
| KR | 10-2008-0060311 A | 7/2008 |

*Primary Examiner* — Asok K Sarkar
(74) *Attorney, Agent, or Firm* — Mills & Onello, LLP

(57) ABSTRACT

In a method of forming an insulation layer pattern, an insulation layer is formed on a substrate. An organic layer and a hard mask layer are successively formed on the insulation layer. A preliminary hard mask pattern having first openings is formed by patterning the hard mask layer. A hard mask pattern having the first openings and second openings is formed by patterning the preliminary hard mask pattern. Width control spacers are formed on sidewalls of the first and the second openings. An etching mask pattern is formed by etching the organic layer using the hard mask pattern as an etching mask. The insulation layer pattern having third openings is formed by etching the insulation layer using the etching mask pattern as an etching mask.

20 Claims, 12 Drawing Sheets

METHODS OF FORMING INSULATION LAYER PATTERNS AND METHODS OF MANUFACTURING SEMICONDUCTOR DEVICES INCLUDING INSULATION LAYER PATTERNS

RELATED APPLICATIONS

This application claims priority under 35 U.S.C. §119 to Korean patent Application No. 10-2009-0025658, filed on Mar. 26, 2009, the contents of which are herein incorporated by reference in their entirety.

BACKGROUND

1. Technical Field

Exemplary embodiments relate to a method of forming an insulation layer pattern, and a method of manufacturing a semiconductor device including an insulation layer pattern. More particularly, example embodiments relate to a method of forming an insulation layer pattern having a minute dimension, and a method of manufacturing a semiconductor device including an insulation layer pattern having a minute dimension.

2. Description of the Related Art

As a degree of integration of a semiconductor device increases, widths of a pattern and a contact in the semiconductor device decrease. However, since a resolution of a photo process is limited, it is difficult to form a minute pattern having a desirably small width and/or a minute opening having a desirably small width in the semiconductor device.

To form a minute contact, a self align contact process that uses an etching selectivity between peripheral patterns and an insulating interlayer has been employed. However, in a case in which a minute opening or a minute pattern is formed in an insulating layer which does not have peripheral patterns, the self align contact process may not be employed.

Alternatively, in order to form an opening having a minute width, an inner spacer may be formed in the opening. However, since it is difficult to uniformly form the inner spacer in the opening, the inner spacer may cause other problems.

Therefore, a method for forming an opening which has a width of about 30 nm, which is less than a resolution limit of the photo process, without causing a defect, may be required.

SUMMARY

Exemplary embodiments provide a method of forming an insulation layer pattern including openings with minute dimensions.

Exemplary embodiments provide a method of manufacturing a semiconductor device including an insulation layer pattern having openings with fine dimensions.

According to one aspect of an exemplary embodiment, there is provided a method of forming an insulation layer pattern. In the method, an insulation layer is formed on a substrate, and an organic layer is formed on the insulation layer. A hard mask layer is formed on the organic layer. A preliminary hard mask pattern having first openings is formed by patterning the hard mask layer. A hard mask pattern having the first openings and second openings is formed by patterning the preliminary hard mask pattern. Width control spacers are formed on sidewalls of the first and the second openings. An etching mask pattern is formed by etching the organic layer using the hard mask pattern as an etching mask. The insulation layer pattern having third openings is formed by etching the insulation layer using the etching mask pattern as an etching mask.

In one exemplary embodiment, the organic layer may be formed using at least one of a photoresist, a polyimide and a silicon-containing material.

In one exemplary embodiment, a protection layer may be additionally formed between the organic layer and the hard mask layer. A protection layer pattern may be formed by patterning the protection layer using the hard mask pattern as an etching mask. In another exemplary embodiment, the protection layer may be formed using a material having an etching selectivity relative to the organic layer and the hard mask layer. In another exemplary embodiment, the first and the second openings may partially expose the protection layer. In another exemplary embodiment, the first openings of the hard mask pattern may be formed by a first photo process and the second openings of the hard mask pattern may be formed by a second photo process.

In one exemplary embodiment, in the formation of the width control spacers according to example embodiments, a width control layer may be formed on the hard mask pattern, sidewalls of the first and the second openings and bottoms of the first and the second openings. The width control layer may be etched to form the width control spacers on the sidewalls of the first and the second openings. In another exemplary embodiment, the width control layer may be formed using at least one of silicon oxide, silicon oxynitride and polysilicon.

In one embodiment, in the formation of the preliminary hard mask pattern, a first photoresist pattern having preliminary first openings may be formed on the hard mask layer. The hard mask layer may be partially etched using the first photoresist pattern as an etching mask to form the preliminary hard mask pattern. In another exemplary embodiment, a second photoresist pattern having preliminary second openings may be formed on the preliminary hard mask pattern. The preliminary hard mask pattern may be etched using the second photoresist pattern as an etching mask to form the hard mask pattern.

In one exemplary embodiment, the width control spacers may be removed before forming the insulation layer pattern. In another exemplary embodiment, the hard mask pattern may be removed from the etching mask pattern before forming the insulation layer pattern. In another exemplary embodiment, the width control spacers and the hard mask pattern may be simultaneously removed.

In one exemplary embodiment, plugs contacting contact regions of the substrate may be further formed in the third openings of the insulation layer pattern.

According to another aspect of an exemplary embodiment, there is provided a method of manufacturing a semiconductor device. In the method of manufacturing the semiconductor device, an underlying structure having contact regions is formed on a substrate. An insulation layer is formed on the substrate to cover the underlying structure. Pads are formed through the insulation layer. The pads may be electrically connected to the contact regions. A mold layer is formed on the insulation layer and the pads. An organic layer is formed on the mold layer, and a hard mask layer is formed on the organic layer. A preliminary hard mask pattern having first openings is formed by patterning the hard mask layer. A hard mask pattern having the first openings and second openings is formed by patterning the preliminary hard mask pattern. Width control spacers are formed on sidewalls of the first and the second openings. An etching mask pattern is formed by etching the organic layer using the hard mask pattern as an etching mask. A mold layer pattern having third openings is formed by etching the mold layer using the etching mask pattern as an etching mask. The third openings may expose the pads. Lower electrodes are formed on bottoms and sidewalls of the third openings. A dielectric layer is formed on the lower electrodes. An upper electrode is formed on the dielectric layer.

In one exemplary embodiment, in the formation of the width control spacers, a width control layer may be formed on the hard mask pattern, on sidewalls of the first and the second openings and on bottoms of the first and the second openings. The width control layer may be anisotropically etched.

In one exemplary embodiment, in the formation of the preliminary hard mask pattern, a first photoresist pattern having preliminary first openings may be formed on the hard mask layer. The hard mask layer may be partially etched using the first photoresist pattern as an etching mask to form the preliminary hard mask pattern. A second photoresist pattern having preliminary second openings may be formed on the preliminary hard mask pattern. The preliminary hard mask pattern may be etched using the second photoresist pattern as an etching mask to form the hard mask pattern.

In one exemplary embodiment, a protection layer may be additionally formed between the organic layer and the hard mask layer. A protection layer pattern may be formed by patterning the protection layer using the hard mask pattern as an etching mask.

According to still another aspect of an exemplary embodiment, there is provided a method of manufacturing a semiconductor device. In the method of manufacturing the semiconductor device, single crystalline pillars are formed on a substrate. Gate insulation layers are formed on sidewalls of the single crystalline pillars. A gate electrode is formed on the gate insulation layers to enclose the single crystalline pillars. An insulation layer is formed on the gate electrode. Impurity regions are formed at upper portions of the single crystalline pillars. A mold layer is formed on the insulation layer and the impurity regions. An organic layer is formed on the mold layer. A hard mask layer is formed on the organic layer. A preliminary hard mask pattern having first openings is formed by patterning the hard mask layer. A hard mask pattern having the first openings and second openings is formed by patterning the preliminary hard mask pattern. Width control spacers are formed on sidewalls of the first and the second openings. An etching mask pattern is formed by etching the organic layer using the hard mask pattern as an etching mask. A mold layer pattern having third openings is formed by etching the mold layer using the etching mask pattern as an etching mask. The third openings may expose the impurity regions, respectively. Lower electrodes are formed on bottoms and sidewalls of the third openings. A dielectric layer is formed on the lower electrodes. An upper electrode is formed on the dielectric layer.

In one exemplary embodiment, in the formation of the width control spacers, a width control layer may be formed on the hard mask pattern, on sidewalls of the first and the second openings and on bottoms of the first and the second openings. The width control layer may be anisotropically etched.

According to exemplary embodiments, the insulation layer pattern having minute openings may be easily obtained, and the semiconductor device may ensure a high integration degree when the semiconductor device is manufactured using the insulation layer pattern. Particularly, the insulation layer pattern having the minute openings may be employed in forming a plug and/or a capacitor in a semiconductor device to considerably improve the integration degree of the semiconductor device.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DESCRIPTION OF EMBODIMENTS

Figure 1:
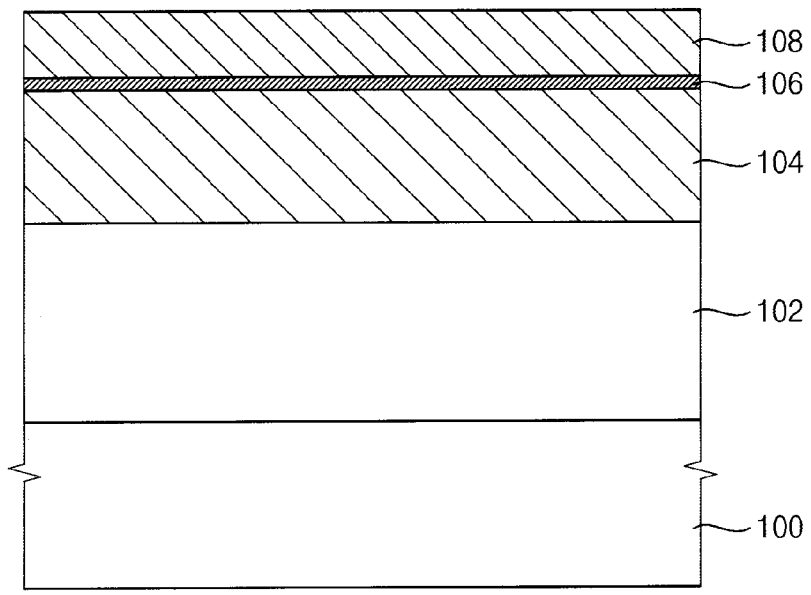
FIGS. 1 to 9 are cross sectional views illustrating a method of forming an insulation layer pattern, in accordance with an exemplary embodiment of the present inventive concept.

Various exemplary embodiments will be described more fully hereinafter with reference to the accompanying drawings, in which some exemplary embodiments are shown. The inventive concept may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

FIGS. 1 to 9 are cross sectional views illustrating a method of forming an insulation layer pattern, in accordance with an exemplary embodiment of the present inventive concept.

Referring to FIG. 1, an insulation layer 102 is formed on a substrate 100. The substrate 100 may include, for example, a semiconductor substrate such as a silicon (Si) substrate, a germanium (Ge) substrate or a silicon-germanium (Si—Ge) substrate. Alternatively, the substrate 100 may include a substrate having a semiconductor layer, for example, a silicon-on-insulator (SOI) substrate or a germanium-on-insulator (GOI) substrate.

The insulation layer 102 may include oxide such as silicon oxide. For example, the insulation layer 102 may be formed using undoped silicate glass (USG), spin on glass (SOG), phosphor silicate glass (PSG), boron silicate glass (BSG), boro-phosphor silicate glass (BPSG), flowable oxide (FOX), tonen Silazene (TOSZ), tetraethyl ortho silicate (TEOS), plasma enhanced-tetraethyl ortho silicate (PE-TEOS) or high density plasma-chemical vapor deposition (HDP-CVD) oxide. Additionally, the insulation layer 102 may be obtained by, for example, a chemical vapor deposition (CVD) process, a plasma enhanced chemical vapor deposition (PECVD) process, a spin coating process or an HDP-CVD process.

In an exemplary embodiment, the insulation layer 102 may have a single layer structure including an oxide film. Alternatively, the insulation layer 102 may have a multi layer structure that includes a plurality of oxide films. In this exemplary embodiment, the oxide films may include substantially the same or substantially similar oxides, respectively.

In an exemplary embodiment, the insulation layer 102 may have a flat surface by a planarization process. To obtain a level surface of the insulation layer 102, the insulation layer 102 may be planarized by a chemical mechanical polishing (CMP) process and/or an etch-back process.

In some exemplary embodiments, an etch stop layer (not illustrated) may be formed between the substrate 100 and the insulation layer 102. The etch stop layer may prevent the substrate 100 from being excessively etched in subsequent processes. The etch stop layer may include a material having an etching selectivity relative to the insulation layer 102 and the substrate 100. For example, the etch stop layer may be formed using nitride such as silicon nitride, or an oxynitride like silicon oxynitride.

An organic layer 104 is formed on the insulation layer 102. The organic layer 104 may include an organic material, for example, photoresist, polyimide or silicon-containing organic material. The organic layer 104 may be formed by, for example, a spin coating process or a CVD process. The organic layer 104 may be easily removed in a successive ashing process and/or a stripping process. The organic layer 104 may have a high etching selectivity relative to the insulation layer 102 in comparison with a hard mask pattern including silicon nitride. When an etching mask for the insulation layer 102 includes the organic layer 104, the etching mask may have a reduced thickness due to the organic layer 104 having the high etching selectivity.

In an exemplary embodiment, the organic layer 104 may have a level surface when the organic layer 104 is provided on the insulation layer 102 having the flat surface. Further, the organic layer 104 may have a more level surface when the organic layer 104 is formed on the flat insulation layer 102 by the spin coating process.

A protection layer 106 is formed on the organic layer 104. The protection layer 106 may be formed by, for example, a CVD process, a PECVD process, an HDP-CVD process or a low pressure chemical vapor deposition (LPCVD) process. Additionally, the protection layer 106 may be formed using silicon oxide, silicon nitride or polysilicon. The protection layer 106 may have a single layer structure that includes, for example, a silicon oxide film, a silicon nitride film or a polysilicon film. The protection layer 106 may protect the organic layer 104 from being damaged in subsequent processes. The protection layer 106 may have a relatively small thickness for sufficiently protecting the organic layer 104. For example, the thickness of the protection layer 106 may be in a range of about 100 Å to about 500 Å.

A hard mask layer 108 is formed on the protection layer 106. The hard mask layer 108 may be formed using a material different from that of the protection layer 106. For example, the hard mask layer 108 may include nitride, oxynitride, oxide or polysilicon. Additionally, the hard mask layer 108 may be formed by, for example, a CVD process, a PECVD process, a low pressure chemical vapor deposition (LPCVD) process or an HDP-CVD process. In an exemplary embodiment, the hard mask layer 108 may have a high etching selectivity relative to the protection layer 106. When the protection layer 106 includes silicon oxide, the hard mask layer 108 may be formed using, for example, silicon nitride, polysilicon or silicon oxynitride. Alternatively, when the protection layer 106 includes silicon nitride or polysilicon, the hard mask layer 108 may include, for example silicon oxide or silicon oxynitride.

In an exemplary embodiment, the hard mask layer 108 may serve as an etching mask for etching the protection layer 106 and the organic layer 104. Thus, the hard mask layer 108 may have a proper thickness such that at least a portion of the hard mask layer 108 may remain on the protection layer 106 while etching the protection layer 106 and the organic layer 104. Since the insulation layer 102 is not etched in the process for etching the protection layer 108 and the organic layer 104, the thickness of the hard mask layer 108 may be in a proper range of about 500 Å to about 1,000 Å.

Figure 2:
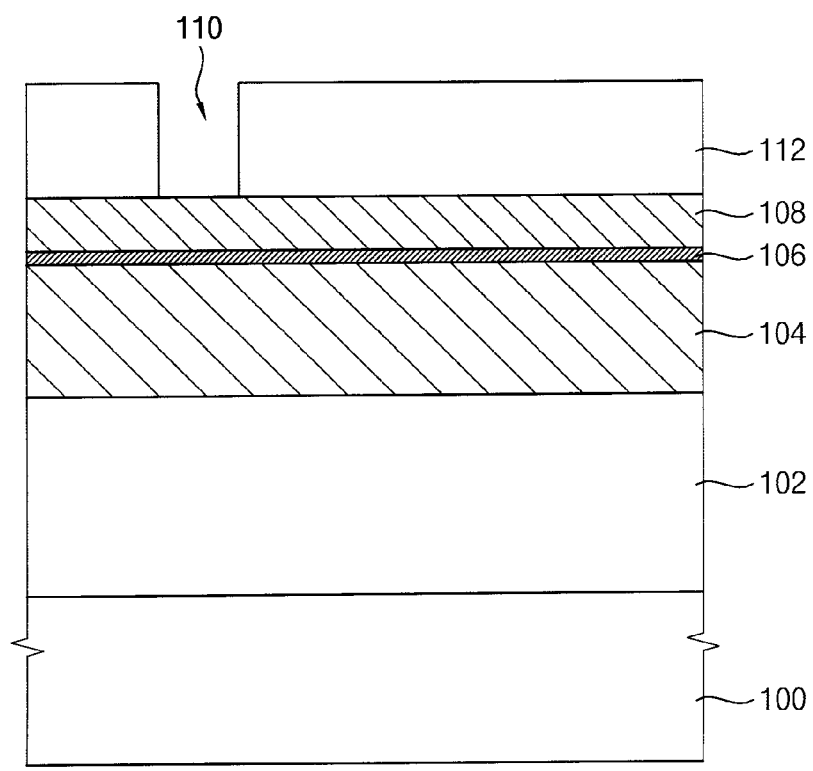

Referring to FIG. 2, a first photoresist film (not illustrated) is formed on the hard mask layer 108. The first photoresist film may be used as an etching mask for patterning the hard mask layer 108. Hence, the first photoresist film may have a relatively small thickness of about 1,000 Å to about 2,000 Å in comparison with that of a conventional photoresist film. When the hard mask layer 108 has a flat surface, the first photoresist film on the hard mask layer 108 may also have a level surface. Here, the first photoresist film may be formed by a spin coating process.

The first photoresist film is patterned by a first photo process to form a first photoresist pattern 112 on the hard mask layer 108. The first photoresist pattern 112 includes preliminary first openings 110. Each of the preliminary first openings 110 may have a shape of a contact hole.

In an exemplary embodiment, the number of the preliminary first openings 110 of the first photoresist pattern 112 may be substantially smaller than the whole number of openings to be formed through the insulation layer 102. Thus, the preliminary first openings 110 may respectively correspond to some of the openings to be formed in the insulation layer 102, but not all of the openings to be formed in the insulation layer 102. For example, the number of the preliminary first openings 110 may be half of the number of all of the openings to be formed through the insulation layer 102.

A width of each of the preliminary first openings 110 formed in the first photoresist pattern 112 may be controlled to a resolution limit of the first photo process for patterning the first photoresist film. Since the surface of the first photoresist film is flat and the thickness of the first photoresist film is relatively small, a depth of focus in the first photo process for patterning the first photoresist film may increase. Accordingly, each of the preliminary first openings 110 in the first photoresist pattern 112 may have a small width.

Figure 3:
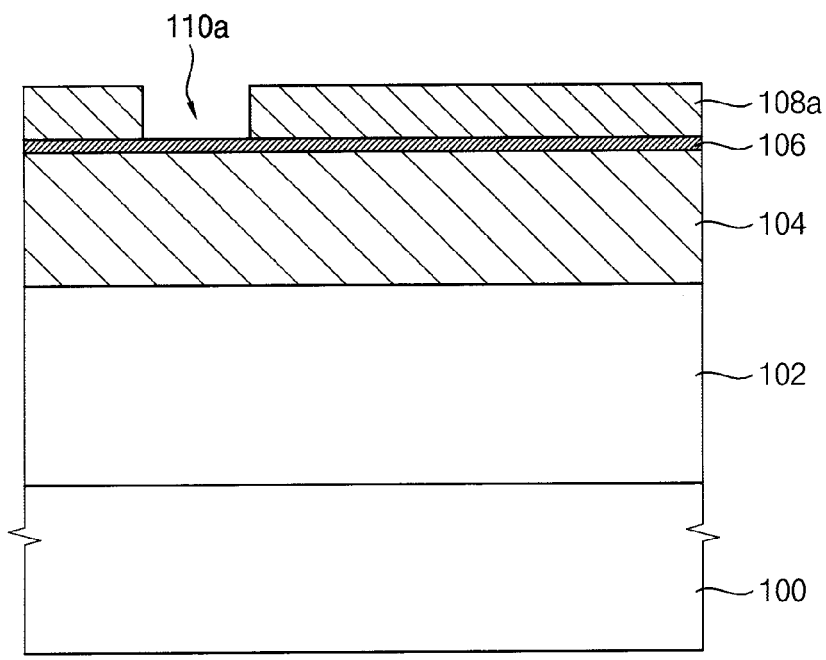

Referring to FIG. 3, the hard mask layer 108 is etched using the first photoresist pattern 112 as an etching mask, so that a preliminary hard mask pattern 108a including first openings 110a is formed on the protection layer 106.

The protection layer 106 is not etched in an etching process of forming the preliminary hard mask pattern 108a having the first openings 110a. The protection layer 106 may be partially exposed by the first openings 110a of the preliminary hard mask pattern 108a. The protection layer 106 may effectively prevent the organic layer 104 from being damaged in the process for forming the preliminary hard mask pattern 108a.

In an exemplary embodiment, the preliminary hard mask pattern 108a is formed using the first photoresist pattern 112 obtained by the first photo process as the etching mask, so that the preliminary hard mask 108a includes the first openings 110a of which the number is substantially smaller than the number of all of the openings to be formed through the insulation layer 102.

The first photoresist pattern 112 is removed from the preliminary hard mask pattern 108a. The first photoresist pattern 112 may be removed by an ashing process and/or a stripping process. Since the surface of the organic layer 104 is covered with the protection layer 106, the organic layer 104 is not damaged or partially removed in the ashing process and/or the stripping process for removing the first photoresist pattern 112.

Figure 4:
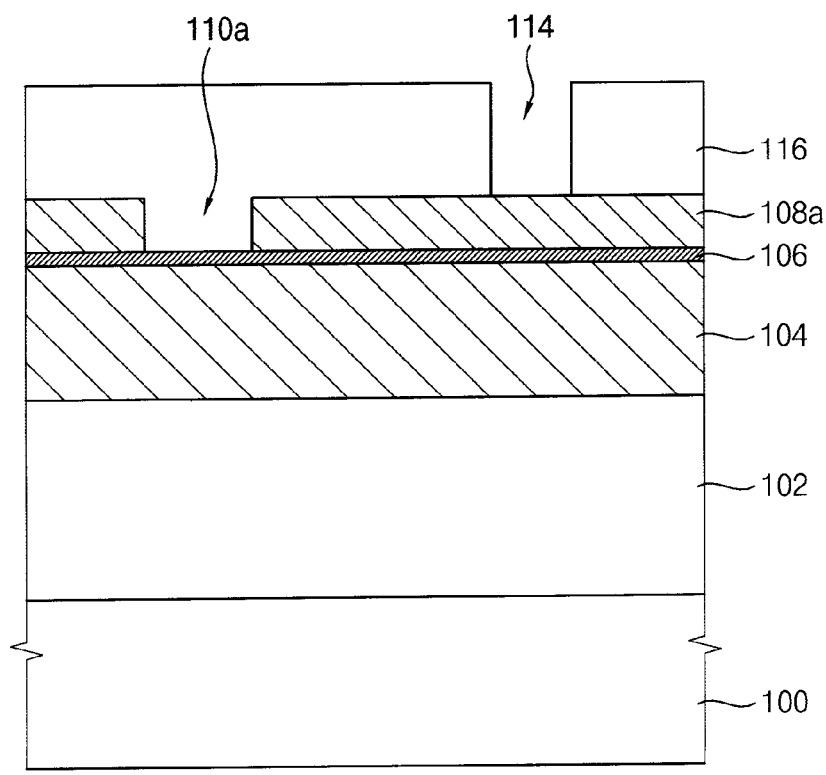

Referring to FIG. 4, a second photoresist film (not illustrated) is formed on the preliminary hard mask pattern 108a. The second photoresist film may be formed by a spin coating process. The second photoresist film is formed on the surface of the preliminary hard mask pattern 108a to fill the first openings 110a of the preliminary hard mask pattern 108a. Thus, the second photoresist film may also have a flat surface because the preliminary hard mask pattern 108 has the level surface and has the relatively small thickness of about 500 Å to about 1,000 Å.

The second photoresist film is patterned by a second photo process to form a second photoresist pattern 116 on the preliminary hard mask pattern 108a. The second photoresist pattern 116 includes preliminary second openings 114. Each of the preliminary second openings 114 may have a shape of a contact hole. The number of the preliminary second openings 114 is also substantially smaller than the number of all of the openings to be formed in the insulation layer 102. Thus, the preliminary second openings 114 may respectively correspond to some of the openings to be formed in the insulating interlayer 102, but not all of the openings to be formed in the insulation layer 102. For example, the number of the preliminary second openings 114 may be substantially equal to the number of openings to be formed in the insulation layer 102 which do not correspond to the preliminary first openings 110 of the first photoresist pattern 112. That is, the preliminary first openings 110 may respectively correspond to some of the openings to be formed in the insulation layer 102 and the preliminary second openings 114 may respectively correspond to the other, remaining openings to be formed in the insulation layer 102.

Regardless of positions of the preliminary second openings 114, all of the preliminary second openings 114 may have substantially the same widths. Alternatively, the widths of the preliminary second openings 114 may vary in accordance with the positions of the preliminary second openings 114. Additionally, the width of each preliminary second opening 114 may be substantially the same as that of corresponding first opening 110. Alternatively, the width of each preliminary second opening 114 may be different from that of the corresponding first openings 110.

When the surface of the second photoresist film is flat, a depth of focus in the second photo process for patterning the second photoresist film may increase. Accordingly, the preliminary second openings 114 of the second photoresist pattern 116 may also have a small width.

Figure 5:
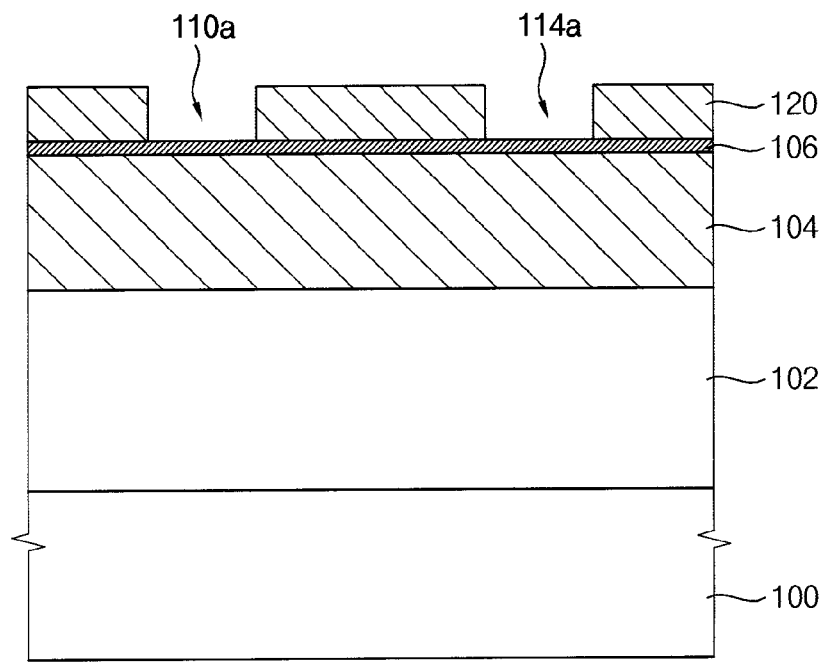

Referring to FIG. 5, the preliminary hard mask pattern 108a is etched using the second photoresist pattern 116 as an etching mask. After the etching process using the second photoresist pattern 116 as the etching mask, a hard mask pattern 120 is formed from the preliminary hard mask pattern 108a. The hard mask pattern 120 includes second openings 114a together with the first openings 110a. That is, the hard mask pattern 120 having the first and the second openings 110a and 114a is obtained through two etching processes using the first and the second photoresist patterns 112 and 116, respectively. The number of first and the second openings 110a and 114a of the hard mask pattern 120 may correspond to the total number of openings to be formed in the insulation layer 102. The protection layer 106 is partially exposed by the first and the second openings 110a and 114a of the hard mask pattern 120.

The second photoresist pattern 116 is removed from the hard mask pattern 120. The second photoresist pattern 116 may be removed by an ashing process and/or a stripping process. Since the surface of the organic layer 104 is covered with the protection layer 106, the organic layer 104 is prevented from being damaged or partially removed in the ashing process and/or the stripping process for removing the second photoresist pattern 116.

In an exemplary embodiment, the hard mask pattern 120 is formed using the first and the second photoresist patterns 112 and 116 as etching masks, widths of the first and the second openings 110a and 114a of the hard mask pattern 120 may be reduced, and also distances among the first and the second openings 110a and 114a may be decreased. Therefore, the number of the first and the second openings 110a and 114a of the hard mask pattern 120 may increase although the hard mask pattern 120 has a limited dimension. As illustrated in FIG. 2, the preliminary first openings 110 of the first photoresist pattern 112 may respectively correspond to some of the openings to be formed in the insulation layer 102, but not to all of the openings to be formed in the insulation layer 102. Thus, a distance between adjacent preliminary first openings 110 may be substantially larger than a distance between adjacent openings to be formed in the insulation layer 102. Additionally, as illustrated in FIG. 4, the preliminary second openings 114 of the second photoresist pattern 116 may respectively correspond to the other, remaining openings to be formed in the insulation layer 102, but not to all of the openings to be formed in the insulation layer 102. Hence, a distance between adjacent preliminary second openings 114 may be substantially larger than a distance between adjacent openings to be formed in the insulation layer 102. As a result, a process margin for forming the hard mask pattern 120 may be sufficiently ensured and the first and the second openings 110a and 114a of the hard mask pattern 120 may have minute widths.

Figure 6:
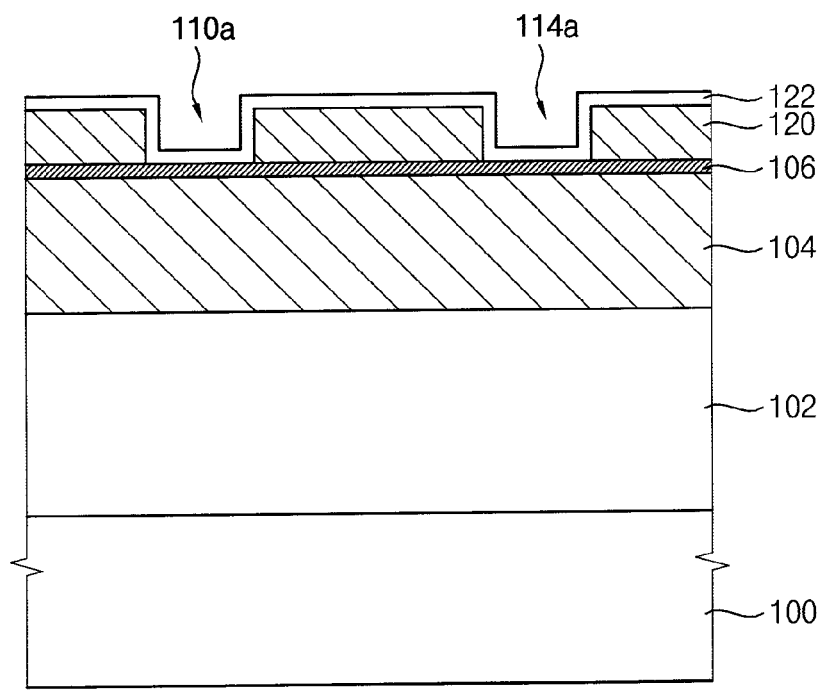

Referring to FIG. 6, a width control layer 122 is formed on the hard mask pattern 120 and on the protection layer 106 exposed by the first and the second openings 110a and 114a of the hard mask pattern 120. The width control layer 122 may be conformally formed along profiles of the hard mask pattern 120 having the first and the second openings 110a and 114a.

In an exemplary embodiment, the width control layer 122 may reduce widths of the openings to be formed in the insulation layer 102. Thus, the width control layer 122 may partially fill the first and the second openings 110a and 114a of the hard mask pattern 120, and may have a uniform thickness along profiles of the first and the second openings 110a and 114a. To obtain the width control layer 122 partially filling the first and the second openings 110a and 114a of the hard mask pattern 120, the width control layer 122 may have a thickness substantially smaller than a half of the width of each of the first and the second openings 110a and 114a.

In an exemplary embodiment, the width control layer 122 may have good step coverage to uniformly cover sidewalls of the first and the second openings 110a and 114a. For example, the width control layer 122 may be formed using silicon oxide at a relatively low temperature. Alternatively, the width control layer 122 may be formed on the hard mask pattern 120 using polysilicon.

Figure 7:
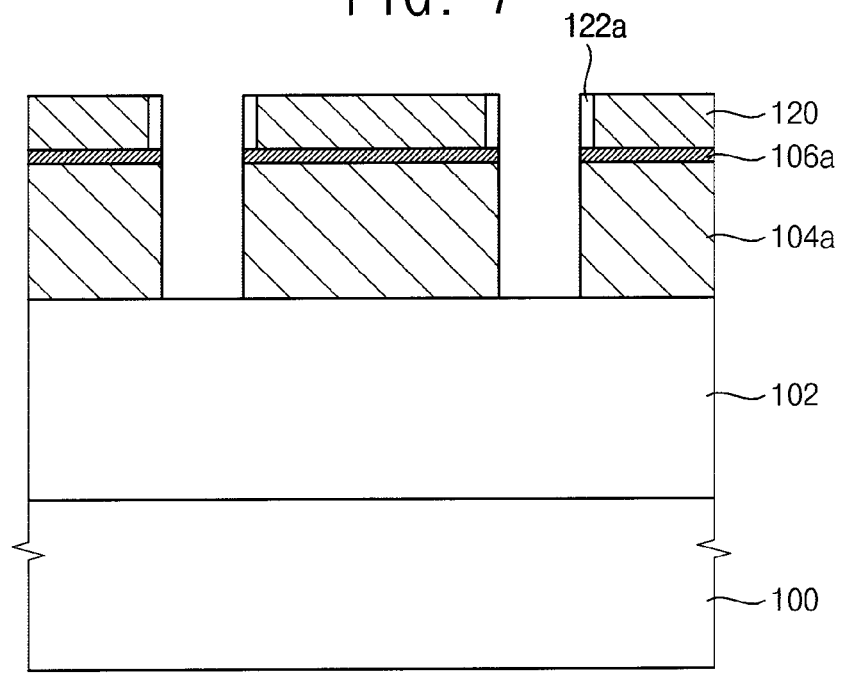

Referring to FIG. 7, the width control layer 122 is etched to form width control spacers 122a on the sidewalls of the first and the second openings 110a and 114a, respectively. That is, portions of the width control layer 122 formed on bottoms of the first and the second openings 110a and 114a and on the surface of the hard mask pattern 120 may be removed to form the width control spacers 122a. The width control spacers 122a may be formed by an anisotropic etching process. When the width control spacers 122a are provided on the sidewalls of the first and the second openings 110a and 114a, the widths of the first and the second openings 110a and 114a may be sufficiently reduced to desired degrees, respectively.

Portions of the protection layer 106 exposed by the first and the second openings 110a and 114a and the width control spacer 122a are removed, such that a protection layer pattern 106a is formed beneath the hard mask pattern 120. In this exemplary embodiment, bottoms of the width control spacers 122a may be positioned on the protection layer pattern 106a. Namely, the protection layer pattern 106a may support the width control spacers 122a.

Portions of the organic layer 104 exposed by the hard mask pattern 120 are also etched to form an etching mask pattern 104a on the insulation layer 102 using the hard mask pattern 120 as an etching mask. The organic layer 104 may be partially etched by an anisotropic etching process. The etching mask pattern 104a may be formed using an etching gas including carbon fluoride (CxFy). For example, the etching mask pattern 104a may be obtained by partially etching the organic layer 104 etched using an etching gas including carbon tetrafluoride ($CF_4$) and oxygen ($O_2$).

In an exemplary embodiment, the etching mask pattern 104a may have openings of which the widths are substantially smaller than those of the first and the second openings 110a and 114a because the width control spacers 122a are located on the sidewalls of the first and the second openings 110a and 114a.

Figure 8:
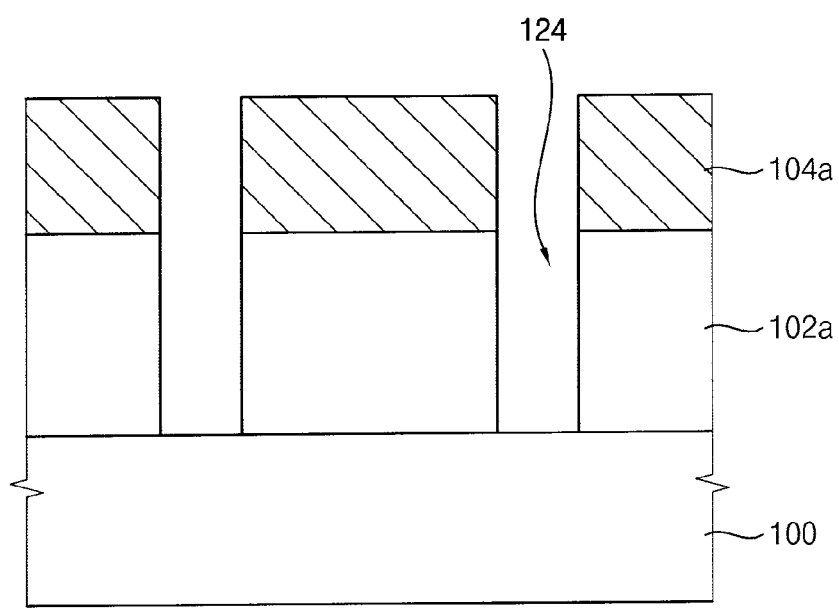

Referring to FIG. 8, the insulation layer 102 is partially etched using the etching mask pattern 104a as an etching mask. The insulation layer 102 may be partially removed by an anisotropic etching process. While partially etching the insulation layer 102, the hard mask pattern 120, the protection layer pattern 106a and the width control spacers 122a may be removed from the etching mask pattern 104a. When the insulation layer 102 is partially etched, an insulation layer pattern 102a having openings 124 is provided on the substrate 100. In this exemplary embodiment, the openings 124 of the insulation layer patterns 102a may also have minute widths because of the above described processes.

Figure 9:
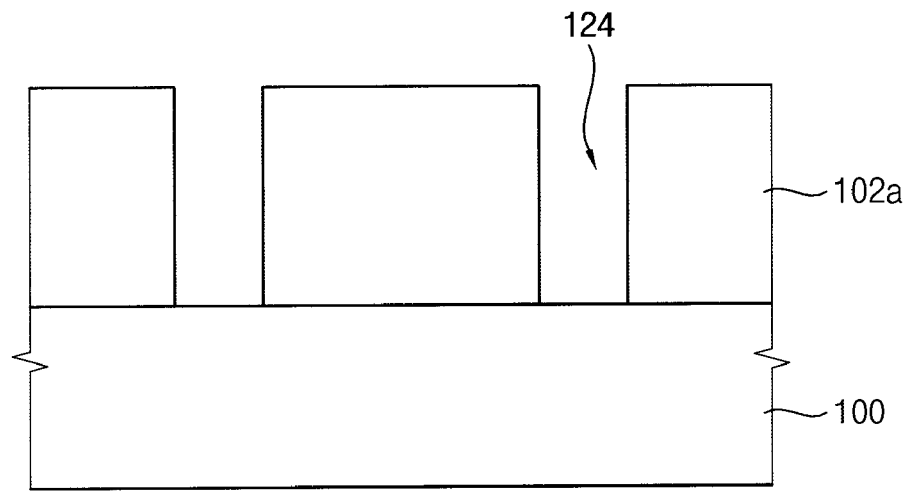

Referring to FIG. 9, the etching mask pattern 104a is removed from the insulation layer pattern 102a to complete the insulation layer pattern 102a having the minute openings 124 on the substrate 100. For example, the etching mask pattern 104a may be removed by an ashing process and/or a stripping process. Even though portions of the hard mask pattern 120, the protection layer pattern 106a and the width control spacers 122a may remain on the etching mask pattern 104a, the remaining portions of the hard mask pattern 120, the protection layer pattern 106a and the width control spacers 122a may be completely removed while etching the etching mask pattern 104a.

In an exemplary embodiment, the processes described with reference to FIGS. 7 to 9 may be performed in-situ using one etching apparatus. That is, the insulation layer pattern 102a may be obtained through several etching processes without any vacuum break.

According to an exemplary embodiment, the insulation layer pattern 102a includes the openings 124 having the minute widths substantially smaller than a resolution limit of a photo process. For example, when the resolution limit of the photo process is about 40 nm, the openings 124 of the insulation layer pattern 102a may have very minute widths reduced to about 30 nm. Additionally, the insulation layer pattern 102a having the minute openings 124 is obtained by an etching process only after forming the etching mask 104a having openings of reduced widths on the insulation layer 102. Therefore, processes for forming the insulation layer pattern 102a may be simplified. Furthermore, an additional process such as a deposition process for reducing the width of the openings 124 of the insulation layer pattern 102a is not required after forming the insulation layer pattern 102a having the openings 124. Therefore, problems caused by the deposition process such as an overhang structure, dandomicity of openings and bowing of openings may be effectively prevented.

Figure 10:
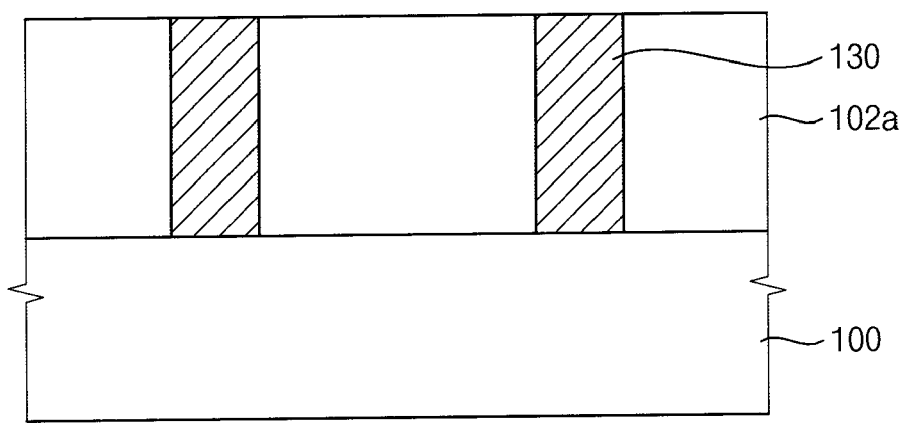
FIG. 10 is a cross sectional view illustrating a method of forming a plug in an insulation layer pattern, in accordance with an exemplary embodiment of the present inventive concept.

FIG. 10 is a cross sectional view illustrating a method of forming a plug in an insulation layer pattern, according to an exemplary embodiment of the present inventive concept.

Referring to FIG. 10, an insulation layer pattern 102a is formed on a substrate 100 through processes substantially the same as or substantially similar to the processes described with reference to FIGS. 1 to 9. The insulation layer pattern 102a includes a minute contact hole, that is, an opening. That is, the contact hole may have a very minute width as described above. The contact hole may expose a predetermined portion of the substrate 100. For example, the contact hole may expose a contact region, an impurity region or a diffusion region. Alternatively, the contact hole may expose a conductive pattern of an underlying structure provided on the substrate 100.

As illustrated in FIG. 10, a conductive layer (not illustrated) is formed on the insulation layer pattern 102a to fill the contact hole. The conductive layer may include, for example, polysilicon, metal and/or metal compound. For example, the conductive layer may be formed using polysilicon doped with impurities, for example, tungsten (W), titanium (Ti), tantalum (Ta), aluminum (Al), tungsten nitride (WNx), aluminum nitride (AlNx), titanium nitride (TiNx) and/or tantalum nitride (TaNx). These impurities may be used alone or in a combination thereof. Further, the conductive layer may be formed by, for example, a CVD process, a sputtering process, an evaporation process, an atomic layer deposition (ALD) process or a pulsed laser deposition (PLD) process.

In an exemplary embodiment, the conductive layer may have a single layer structure that includes, for example, a polysilicon film, a metal film or a metal compound film. Alternatively, the conductive layer may have a multi layer structure that includes, for example, at least one polysilicon film, at least one metal film and/or at least one metal compound film.

In an exemplary embodiment, a barrier layer (not illustrated) may be formed on a bottom or a sidewall of the contact hole before forming the conductive layer. The barrier layer may be formed using metal and/or metal compound by, for example, a CVD process, an ALD process, a sputtering process, a PLD process or an evaporation process. The barrier layer may prevent metal atoms and/or metal ions from diffusing into the substrate 100 in successive processes.

The conductive layer is partially removed until the insulation layer pattern 102a is exposed to form a plug 130 in the contact hole. The plug 130 may be formed by, for example, a CMP process and/or an etch-back process. The plug 130 makes contact with the predetermined portion of the substrate 100 or the conductive pattern of the underlying structure.

According to an exemplary embodiment, the plug 130 may have a very minute dimension in accordance with the fine contact hole of the insulation layer pattern 102a. When the plug 130 having the considerably minute size serves as a wiring, a contact or a pad in a semiconductor device, the semiconductor device may ensure a high integration degree.

FIGS. 11 to 16 are cross sectional views illustrating a method of manufacturing a semiconductor device, in accordance with an exemplary embodiment of the present inventive concept. Although a DRAM device may be manufactured by the method illustrated in FIGS. 11 to 16, the method may be employed in manufacturing of other semiconductor devices such as an SRAM device or a flash memory device.

Figure 11:
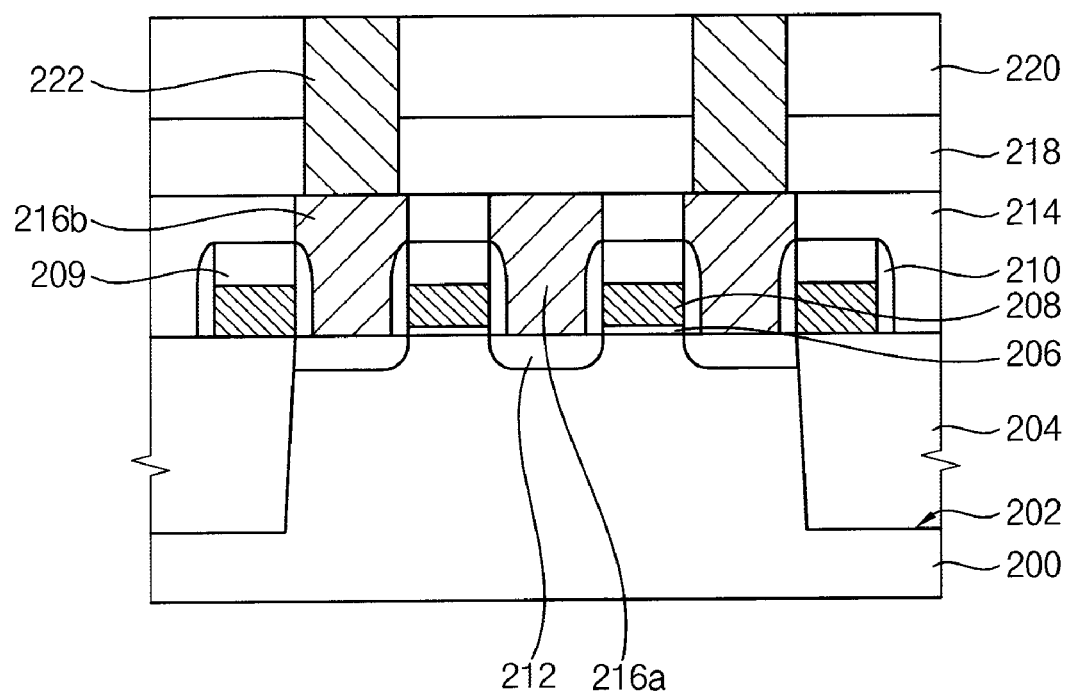
FIGS. 11 to 16 are cross sectional views illustrating a method of manufacturing a semiconductor device, in accordance with an exemplary embodiment of the present inventive concept.

Referring to FIG. 11, a pad oxide layer (not illustrated) and a first hard mask layer (not illustrated) are successively formed on a substrate 200. The substrate 200 may include, for example, a semiconductor substrate or a substrate having a semiconductor layer thereon. The pad oxide layer may include silicon oxide and the first hard mask layer may include, for example, nitride or oxynitride.

The pad oxide layer and the first hard mask layer are patterned to form a pad oxide layer pattern (not illustrated) and a first hard mask pattern (not illustrated) on the substrate 200. The substrate 200 is partially etched using the first hard mask pattern as an etching mask to form a trench 202 on the substrate 200.

An isolation layer (not illustrated) is formed on the substrate 200 to fill up the trench 202. The isolation layer may be formed using oxide by, for example, a CVD process, a PECVD process, an HDP-CVD process, a thermal oxidation process or a spin coating process. The isolation layer is partially removed until the substrate 200 is exposed. Hence, an isolation layer pattern 204 in formed in the trench 202. The isolation layer pattern 202 may define an active region and a field region of the substrate 200.

A gate structure is formed on the active region of the substrate 200. The gate structure includes a gate insulation layer 206, a gate electrode 208 and a gate mask 209 sequentially formed on the substrate 200. The gate insulation layer 206 may include, for example, silicon oxide and/or metal oxide and the gate electrode 208 may include, for example, doped polysilicon, metal, metal nitride and/or metal silicide. Additionally, the gate mask 209 may be formed using, for example, nitride or oxynitride.

A gate spacer 210 is formed on a sidewall of the gate structure. The gate spacer 210 may be formed using nitride or oxynitride by, for example, a CVD process, a PECVD process or an LPCVD process.

Impurities are doped into portions of the substrate 200 adjacent to the gate structure to form impurity regions 212 serving as source/drain regions. As a result, a transistor including the gate structure and the impurity regions 212 is provided on the substrate 200. The transistor may include a MOS transistor. In this exemplary embodiment, the gate electrode 208 may have, for example, a line shape or a bar shape that extends on the substrate 200. The gate electrode 208 may serve as a word line in the semiconductor device.

A first insulation layer 214 is formed on the substrate 200 to cover the transistor. The first insulation layer 214 may be formed using oxide such as silicon oxide. For example, the first insulation layer 214 may include undoped silicate glass (USG), spin on glass (SOG), boro-phosphor silicate glass (BPSG), phosphor silicate glass (PSG), flowable oxide (FOX), Tonen silazene (TOSZ), tetraethyl ortho silicate (TEOS), plasma enhanced-TEOS (PE-TEOS) or HDP-CVD oxide. The first insulation layer 214 may be obtained by, for example, a CVD process, a PECVD process, an HDP-CVD process or a spin coating process.

The first insulation layer 214 is partially etched to form first contact holes that expose the impurity regions 212. The first contact holes are filled with a first conductive material to thereby form first and second pads 216a and 216b on the impurity regions 212, respectively. The first conductive material may include, for example, doped polysilicon, metal and/or metal compound.

A second insulation layer 218 is formed on the first insulation layer 214. The second insulation layer 218 may include oxide, for example, silicon oxide. For example, the second insulation layer 218 may be formed using, for example, USG, SOG, BPSG, PSG, FOX, TOSZ, TEOS, PE-TEOS or HDP-CVD oxide. Further, the second insulation layer 218 may be formed by, for example, a CVD process, a PECVD process, an HDP-CVD process or a spin coating process.

The second insulation layer 218 is partially etched to form second contact holes exposing surfaces of the first pads 216a, respectively. The second contact holes are filled with a second conductive material to form bit line contacts (not illustrated) on the first pads 216a. The second conductive material may also include, for example, doped polysilicon, metal and/or metal compound.

Bit line structures (not illustrated) are formed on the bit line contacts and the second insulation layer 218. Each of the bit line structures may include a bit line and a bit line mask successively positioned on each bit line contact. In this exemplary embodiment, the bit line may include, for example, metal and/or metal compound, and the bit line mask may include, for example, nitride or oxynitride.

A third insulation layer 220 is formed on the second insulation layer 218 to cover the bit line structures. The third insulation layer 220 may also include oxide, for example, USG, SOG, BPSG, PSG, FOX, TOSZ, TEOS, PE-TEOS or HDP-CVD oxide. Additionally, the third insulation layer 220 may be formed by, for example, a CVD process, a PECVD process, an HDP-CVD process or a spin coating process.

The third insulation layer 220 and the second insulation layer 218 are partially etched to form third contact holes that expose surfaces of the second pads 216b. That is, the third contact holes are formed through the second and the third insulation layers 218 and 220.

The third contact holes are filled with a third conductive material to form third pads 222 on the second pads 216b. The third pads 222 may include, for example, doped polysilicon, metal and/or metal nitride.

Figure 12:
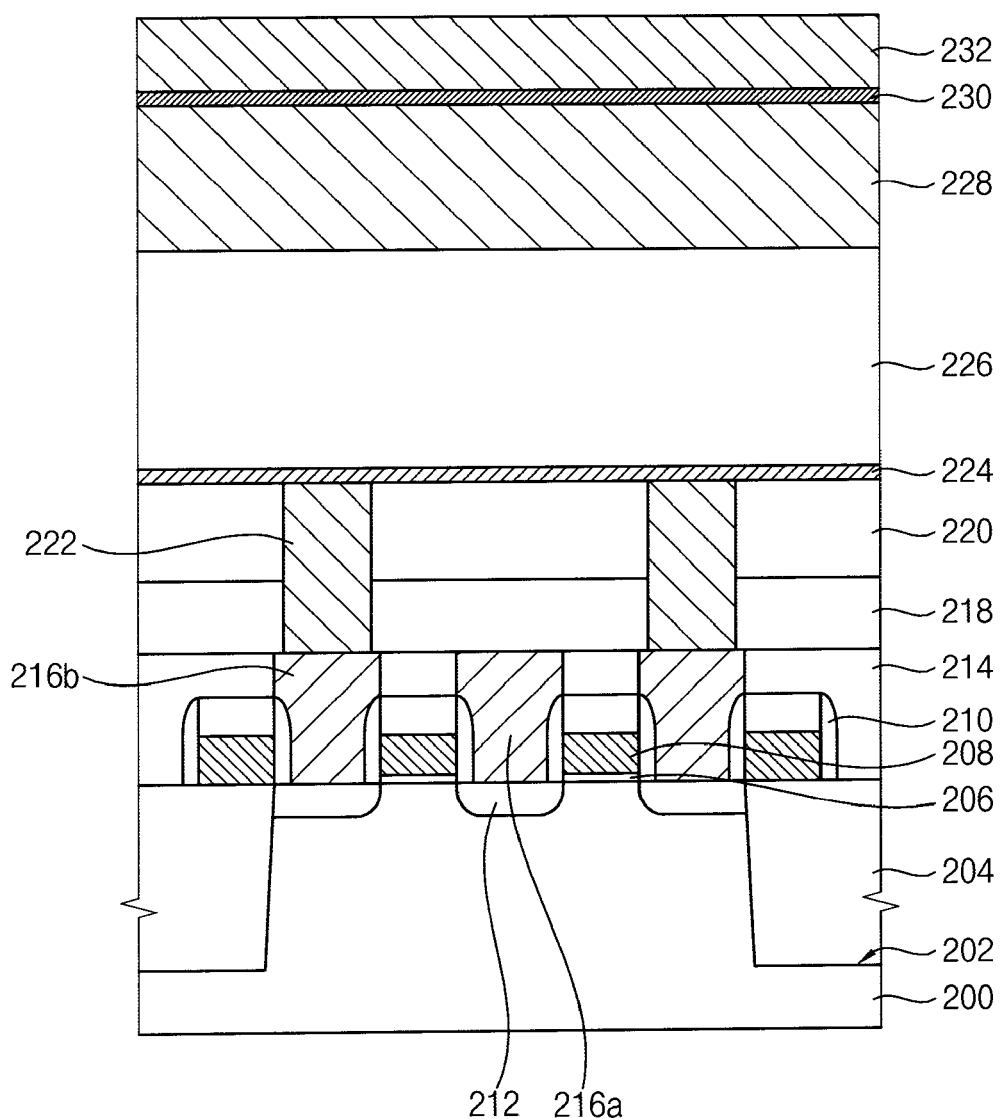

Referring to FIG. 12, an etch stop layer 224 is formed on the third insulation layer 220 and the third pads 222. The etch stop layer 224 may be formed using nitride or oxynitride by, for example, a CVD process, a PECVD process or an HDP-CVD process.

Figure 16:
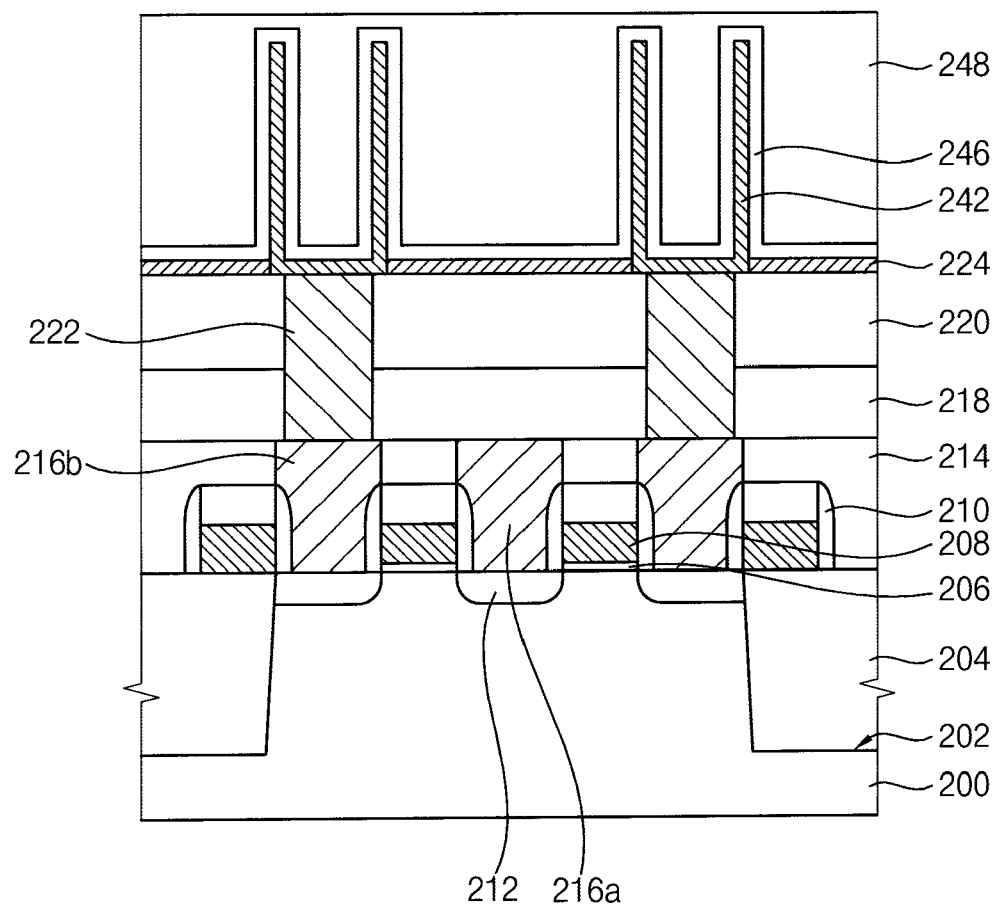

A mold layer 226 is formed on the etch stop layer 224. The mold layer 226 may be formed using oxide by, for example, a CVD process, a PECVD process, an HDP-CVD process or a spin coating process. For example, the mold layer 226 may include USG SOG, BPSG, PSG, FOX, TOSZ, TEOS, PE-TEOS, or HDP-CVD oxide. In an exemplary embodiment, the mold layer 226 may have a thickness substantially the same as or substantially lager than a desired height of lower electrodes 242, as illustrated in FIG. 16.

An organic layer 228 is formed on the mold layer 226. The organic layer 228 may be formed using an organic material such as photoresist, polyimide or silicon-containing organic material. Further, the organic layer 228 may be formed by, for example, a spin coating process or a CVD process.

A protection layer 230 and a hard mask layer 232 are successively formed on the organic layer 228. The organic layer 228, the protection layer 230 and the hard mask layer 232 may be formed using materials and processes substantially the same as or substantially similar to those described with reference to FIG. 1.

Figure 13:
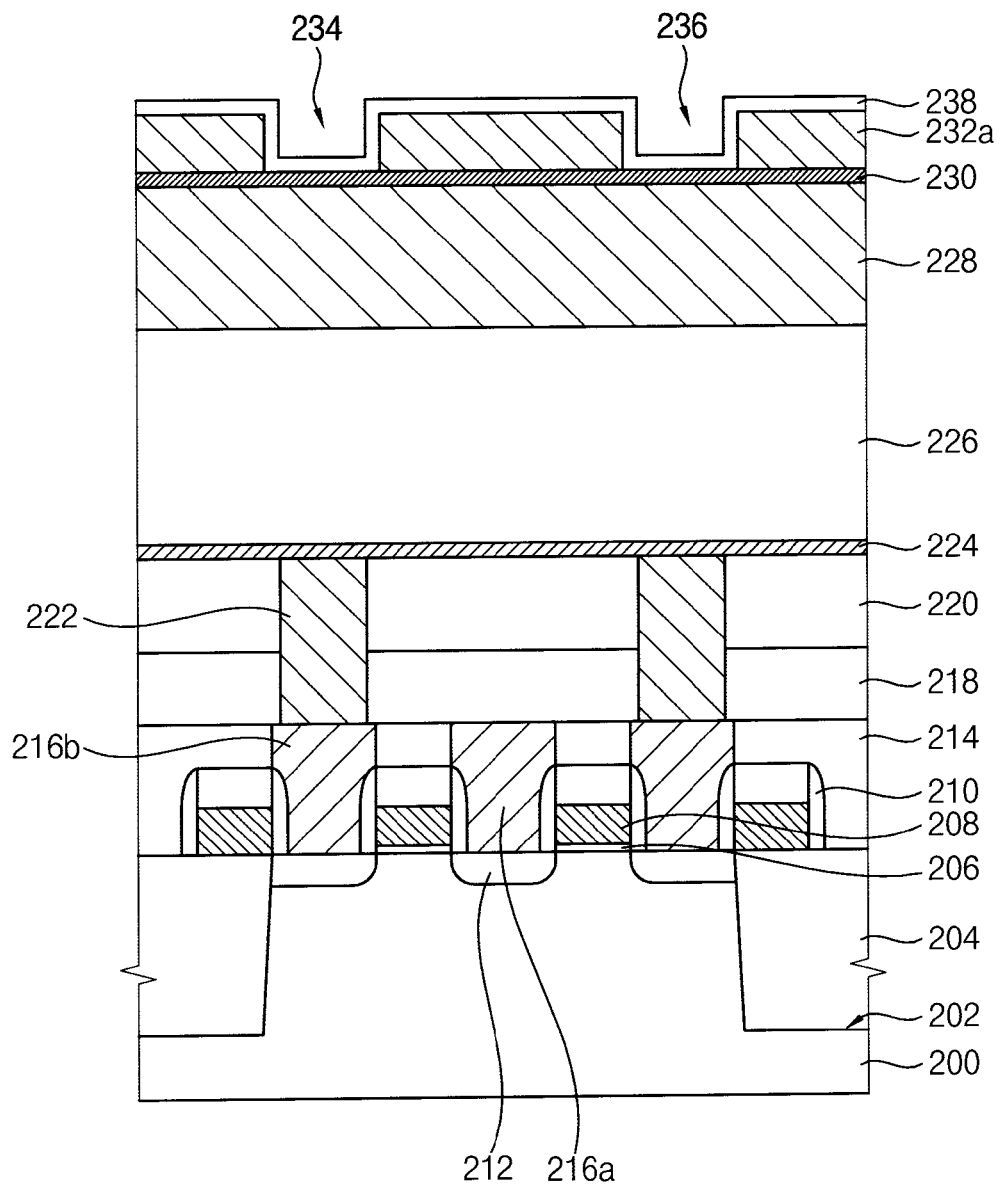

Referring to FIG. 13, the hard mask layer 232 is patterned through two photo processes, so that a hard mask pattern 232a is formed on the protection layer 230. The hard mask layer pattern 232a includes first openings 234 and second openings 236, which partially expose the protection layer 230. That is, the hard mask layer 232 is etched to form a preliminary hard mask pattern (not illustrated) on the protection layer 230. The preliminary hard mask pattern may include the first openings 234 positioned over first portions of the mold layer 226 where the lower electrodes 242 are formed. Then, the preliminary hard mask pattern is etched to form the hard mask pattern 232a having the first and the second openings 234 and 236. Here, the second openings 236 may also be located over second portions of the mold layer 226 where the lower electrodes 242 are formed, as illustrated in FIG. 16. Thus, the hard mask pattern 232a includes the first and second openings 234 and 236, which may be respectively correspond to portions of the mold layer 226 at which the lower electrodes 242 will be formed, as illustrated in FIG. 16.

A width control layer 238 is formed on the hard mask pattern 232a having the first and the second openings 234 and 236. The width control layer 238 may be conformally formed along profiles of the first and the second openings 234 and 236. The hard mask pattern 232a and the width control layer 238 may be formed by processes substantially the same as or substantially similar to the processes described with reference to FIGS. 2 to 6.

Figure 14:
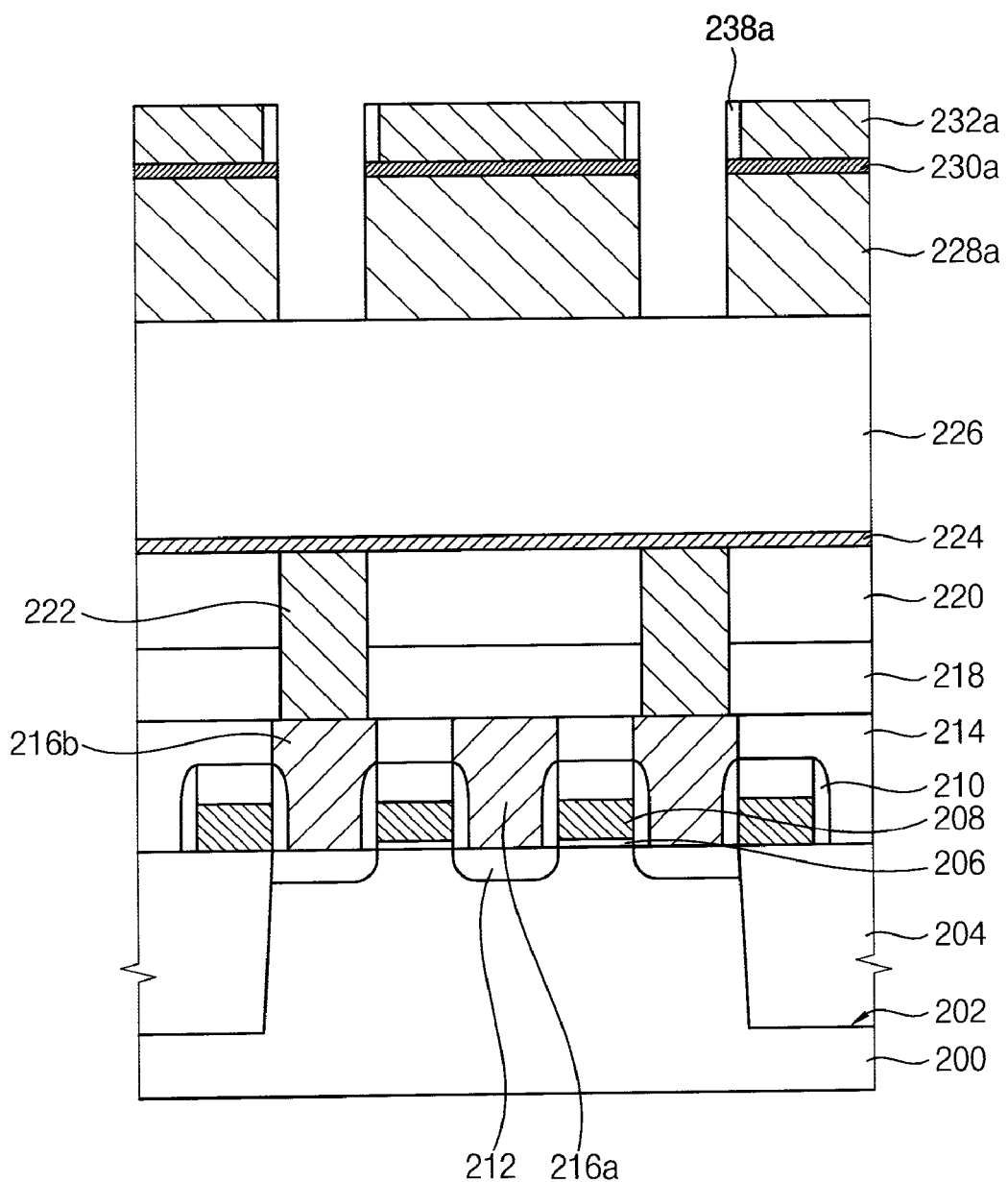

Referring to FIG. 14, the width control layer 238 and the protection layer 230 are partially etched to form width control spacers 238a and a protection layer pattern 230a. The width control spacers 238a are located on sidewalls of the first and the second openings 234 and 236. The protection layer pattern 230a is positioned on the organic layer 228.

The organic layer 228 is partially etched using the hard mask pattern 232a and the width control spacers 238 as etching masks to form an etching mask pattern 228a on the mold layer 226. The etching mask 228a may be obtained by processes substantially the same as or substantially similar to the processes described with reference to FIGS. 7 and 8.

Figure 15:
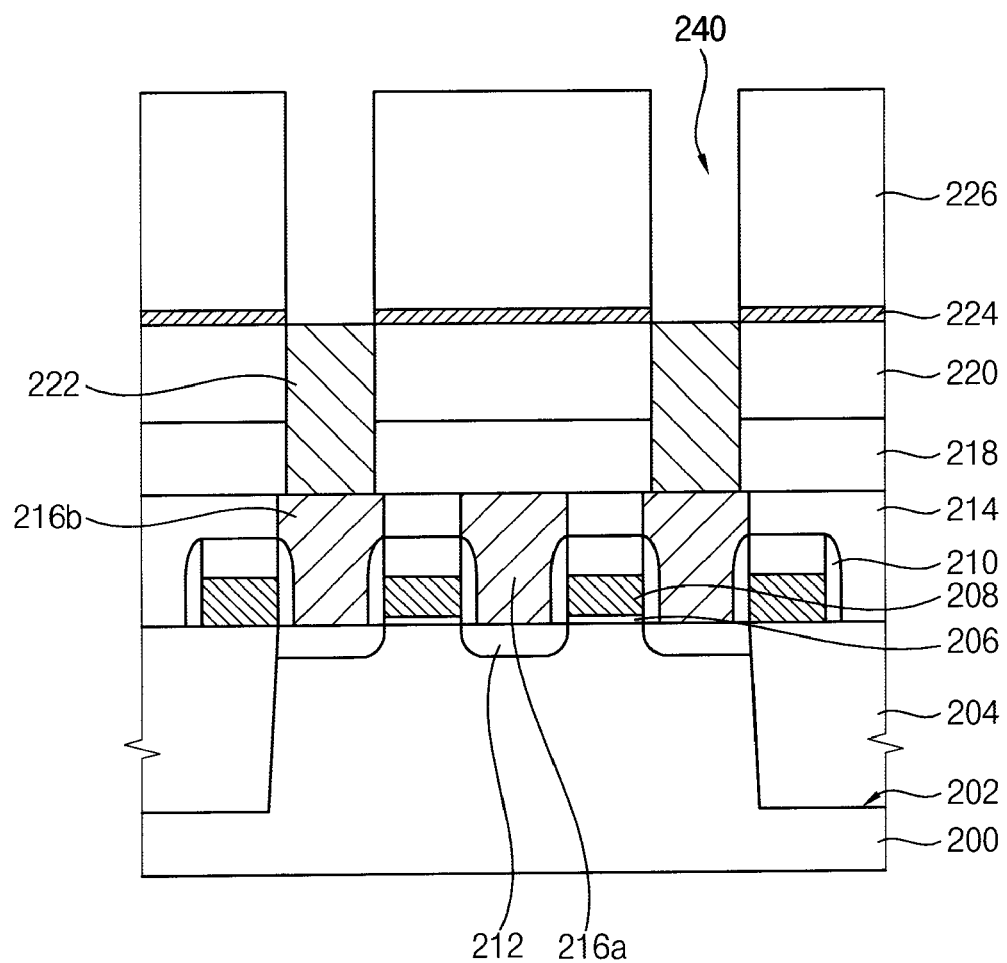

Referring to FIG. 15, the mold layer 226 and the etch stop layer 224 are etched using the etching mask pattern 228a as an etching mask to form openings 240 through the mold layer 226 and the etch stop layer 224.

In an exemplary embodiment, the openings 240 for the lower electrodes 242 expose the third pads 222 positioned on the second pads 216b. Each of the openings 240 may have a relatively minute width as described above. The lower electrodes 242, as illustrated in FIG. 16, may be electrically connected to the impurity regions 212 through the third pads 222 and the second pads 216b.

The etching mask pattern 228a is removed from the mold layer 226. The etching mask pattern 228a may be removed by an ashing process and/or a stripping process.

Referring to FIG. 16, a conductive layer (not illustrated) is formed on the mold layer 226, the exposed third pads 222 and sidewalls of the openings 240. The conductive layer may have a uniform thickness along profiles of the openings 240. The conductive layer may be formed using, for example, doped polysilicon, metal and/or metal compound. Further, the conductive layer may be formed by, for example, a sputtering process, an ALD process, a CVD process, an evaporation process or a PLD process.

In an exemplary embodiment, a sacrificial layer (not illustrated) is formed on the conductive layer to fill the openings 240. In this exemplary embodiment, the sacrificial layer may completely fill the openings 240. The sacrificial layer may be formed using oxide by, for example, a CVD process, a PECVD process, an LPCVD process or an HDP-CVD process. The sacrificial layer and the conductive layer are partially removed until the mold layer 226 is exposed. Thus, the lower electrode 242 and sacrificial layer patterns may be formed in the openings 240. The lower electrodes 242 are located on the third pads 222 and the sidewalls of the opening 240 whereas the sacrificial layer patterns are positioned on the lower electrodes 242, respectively. The lower electrodes 242 and the sacrificial layer patterns may be formed by, for example, a CMP process and/or an etch-back process. Each of the lower electrodes 242 may have, for example, a circular, an elliptical or a polygonal cylindrical structure.

The sacrificial layer patterns and the mold layer 226 are removed from the lower electrodes 242. When the sacrificial layer patterns and the mold layer 226 are etched, the lower electrodes 242 having the cylindrical structure are provided on the third pads 222 and the etch stop layer 224.

A dielectric layer 246 is formed on the lower electrodes 242 and the etch stop layer 224. The dielectric layer 246 may be formed using, for example, oxide, nitride and/or metal oxide. The dielectric layer 246 may be conformally formed along profiles of the lower electrodes 242.

An upper electrode 248 is formed on the dielectric layer 246, and thus a capacitor is formed over the substrate 200. The upper electrode 248 may include, for example, doped polysilicon, metal and/or metal compound. The upper electrode 248 may have a plate electrode structure.

According to an exemplary embodiment, the openings 240 having the minute widths may be easily formed through the mold layer 226. Therefore, the lower electrodes 242 may be provided in the minute openings 240 while ensuring a sufficient distance between adjacent the lower electrodes. As a result, the semiconductor device including the lower electrode 242 may have improved integration degree.

Figure 17:
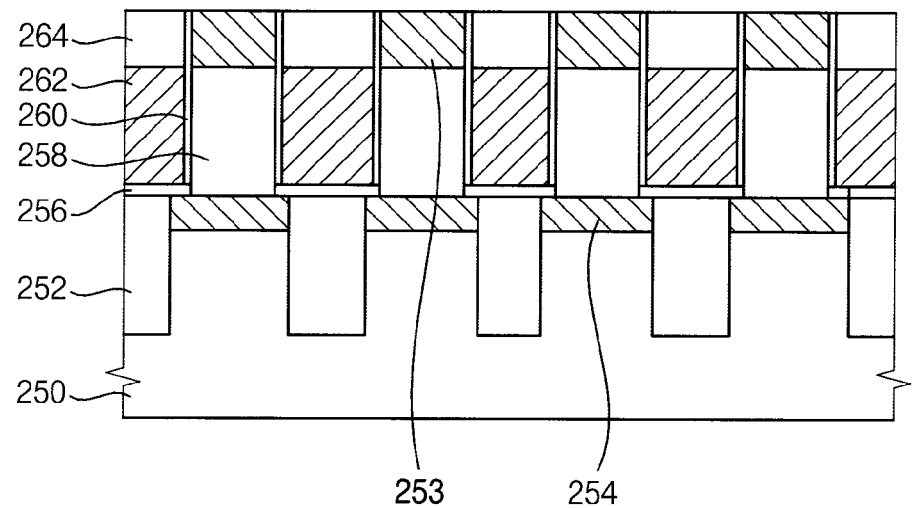
FIGS. 17 and 18 are cross sectional views illustrating a method of manufacturing a semiconductor device, in accordance with an exemplary embodiment of the present inventive concept.
Figure 18:
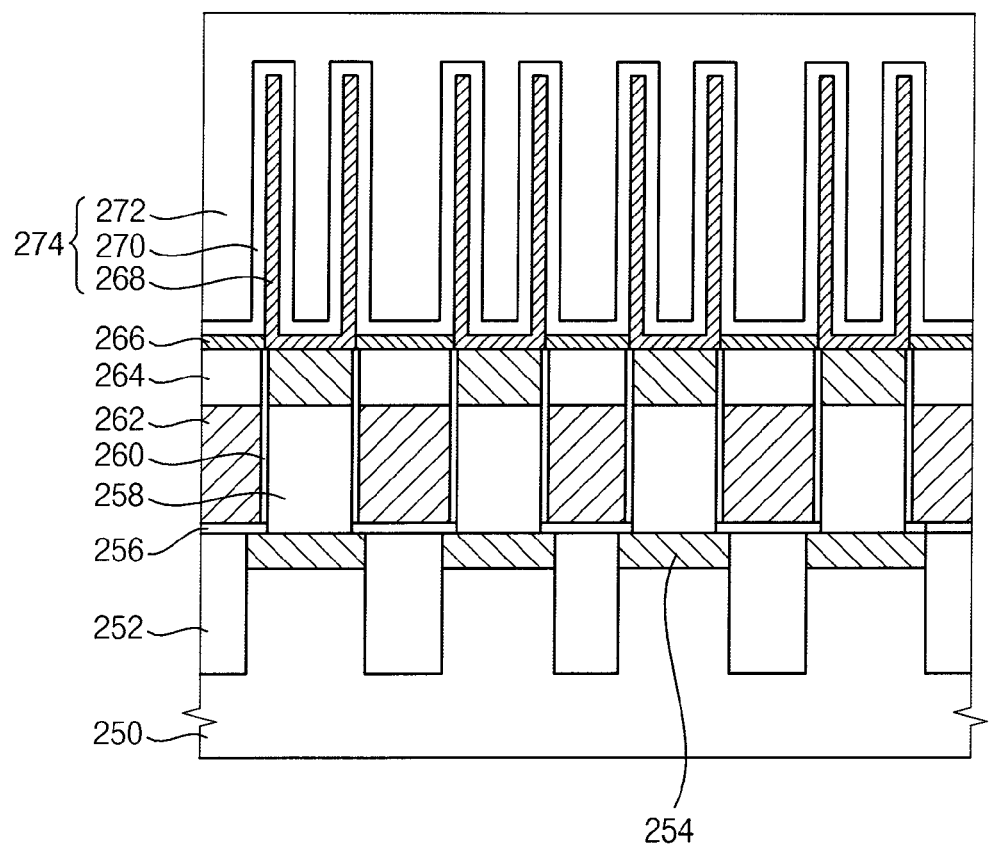

FIGS. 17 and 18 are cross sectional views illustrating a method of manufacturing a semiconductor device, in accordance with an exemplary embodiment of the present inventive concept.

Referring to FIG. 17, an isolation layer 252 is formed on a substrate 250 to define an active region and a field region. The substrate 250 may include, for example, a single crystalline silicon substrate. A single crystalline pillar 258 is formed on the substrate 250 by partially etching the substrate 250 or by performing a selective epitaxial growth process. The single crystalline pillar 258 may protrude from the active region of the substrate 250.

A buried bit line 254 is formed at a portion of the active region of the substrate 250. The buried bit line 254 may be formed by doping impurities into the portion of the active region.

A gate insulation layer 260 is formed on a sidewall of the single crystalline pillar 258. The gate insulation layer 260 may include, for example, silicon oxide and/or metal oxide. A gate electrode 262 is formed on the gate insulation layer 260 to enclose the single crystalline pillar 258. The gate electrode 262 may extend along a direction substantially perpendicular to a direction in which the active region extends. The gate electrode 262 may be formed using, for example, polysilicon, metal and/or metal compound. For example, the gate electrode 262 may have a line structure or a bar structure.

An insulation layer pattern 256 is formed between the gate electrode 262 and the substrate 250. The insulation layer pattern 256 may be formed using, for example, oxide, nitride and/or oxynitride.

An insulating interlayer 264 is formed on the gate electrode 262 to fill a gap between adjacent gate electrodes 262. The insulating interlayer 264 may include oxide, for example, silicon oxide. Surfaces of the insulating interlayer 264 and the single crystalline pillar 258 may be located on substantially the same plane.

An impurity region 253 is formed at an upper portion of the single crystalline pillar 258 by doping impurities into the single crystalline pillar 258. Therefore, a vertical pillar transistor is provided on the substrate 250. In an exemplary embodiment, a plurality of vertical pillar transistors may be formed on the substrate 250.

Referring to FIG. 18, an etch stop layer 266 and a cylindrical capacitor 274 are formed on the impurity region 253 and the insulating interlayer 264. The cylindrical capacitor 274 includes a lower electrode 268, a dielectric layer 270 and an upper electrode 272 successively formed on the impurity region 253 and the insulating interlayer 264. Each of the lower and the upper electrode 268 and 272 may include, for example, doped polysilicon, metal and/or metal compound. Additionally, the dielectric layer 270 may be formed using, for example, oxide, nitride and/or metal oxide.

In an exemplary embodiment, the etch stop layer 266 and the cylindrical capacitor 274 may be formed by processes substantially the same as or substantially similar to the processes described with reference to FIGS. 12 to 16. Therefore, the lower electrodes 268 of the cylindrical capacitor 274 may be separated by a sufficient distance to enhance an integration degree of the semiconductor device.

According to exemplary embodiments, an insulation layer pattern having minute openings may be easily obtained, and a semiconductor device may ensure a high integration degree when the semiconductor device is manufactured using the insulation layer pattern. For example, the insulation layer pattern having the minute openings may be employed in forming a plug and/or a capacitor in a semiconductor device to greatly improve the integration degree of the semiconductor device.

The foregoing is illustrative of example embodiments, and is not to be construed as limiting thereof. Although a few exemplary embodiments have been described, those skilled in the art will readily appreciate that many modifications are possible in the exemplary embodiments without materially departing from the novel teachings and advantages of the exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of forming an insulation layer pattern, comprising:

forming an insulation layer on a substrate;

forming an organic layer on the insulation layer;

forming a hard mask layer on the organic layer;

forming a preliminary hard mask pattern having first openings by patterning the hard mask layer;

forming a hard mask pattern having the first openings and second openings by patterning the preliminary hard mask pattern;

forming width control spacers on sidewalls of the first and the second openings;

forming an etching mask pattern by etching the organic layer using the hard mask pattern as an etching mask; and forming an insulation layer pattern having third openings by etching the insulation layer using the etching mask pattern as an etching mask.

2. The method of claim 1, wherein the organic layer is formed using at least one of photoresist, polyimide and a silicon-containing material.

3. The method of claim 1, further comprising:
forming a protection layer between the organic layer and the hard mask layer; and
forming a protection layer pattern by patterning the protection layer using the hard mask pattern as an etching mask.

4. The method of claim 3, wherein the protection layer is formed using a material having an etching selectivity relative to the organic layer and the hard mask layer.

5. The method of claim 3, wherein the first and the second openings partially expose the protection layer.

6. The method of claim 3, wherein the first openings of the hard mask pattern are formed by a first photo process and the second openings of the hard mask pattern are formed by a second photo process.

7. The method of claim 1, wherein forming the width control spacers comprises:
forming a width control layer on the hard mask pattern, sidewalls of the first and the second openings and bottoms of the first and the second openings; and
etching the width control layer to form the width control spacers on the sidewalls of the first and the second openings.

8. The method of claim 6, wherein the width control layer is formed using at least one of silicon oxide, silicon oxynitride and polysilicon.

9. The method of claim 1, wherein forming the preliminary hard mask pattern comprises:
forming a first photoresist pattern having preliminary first openings on the hard mask layer; and
partially etching the hard mask layer using the first photoresist pattern as an etching mask to form the preliminary hard mask pattern.

10. The method of claim 9, wherein forming the hard mask pattern comprises:
forming a second photoresist pattern having preliminary second openings on the preliminary hard mask pattern; and
etching the preliminary hard mask pattern using the second photoresist pattern as an etching mask to form the hard mask pattern.

11. The method of claim 1, further comprising removing the width control spacers before forming the insulation layer pattern.

12. The method of claim 11, further comprising removing the hard mask pattern from the etching mask pattern before forming the insulation layer pattern.

13. The method of claim 12, wherein the width control spacers and the hard mask pattern are simultaneously removed.

14. The method of claim 1, further comprising forming plugs contacting contact regions of the substrate in the third openings of the insulation layer pattern.

15. A method of manufacturing a semiconductor device, comprising:
forming an underlying structure having contact regions on a substrate;
forming an insulation layer on the substrate to cover the underlying structure;
forming pads through the insulation layer, the pads being electrically connected to the contact regions;
forming a mold layer on the insulation layer and the pads;
forming an organic layer on the mold layer;
forming a hard mask layer on the organic layer;
forming a preliminary hard mask pattern having first openings by patterning the hard mask layer;
forming a hard mask pattern having the first openings and second openings by patterning the preliminary hard mask pattern;
forming width control spacers on sidewalls of the first and the second openings;
forming an etching mask pattern by etching the organic layer using the hard mask pattern as an etching mask;
forming a mold layer pattern having third openings by etching the mold layer using the etching mask pattern as an etching mask, the third openings exposing the pads;
forming lower electrodes on bottoms and sidewalls of the third openings;
forming a dielectric layer on the lower electrodes; and
forming an upper electrode on the dielectric layer.

16. The method of claim 15, wherein forming the width control spacers comprises:
forming a width control layer on the hard mask pattern, on sidewalls of the first and the second openings and on bottoms of the first and the second openings; and
anisotropically etching the width control layer.

17. The method of claim 15, wherein forming the preliminary hard mask pattern comprises:
forming a first photoresist pattern having preliminary first openings on the hard mask layer;
partially etching the hard mask layer using the first photoresist pattern as an etching mask to form the preliminary hard mask pattern;
forming a second photoresist pattern having preliminary second openings on the preliminary hard mask pattern; and
etching the preliminary hard mask pattern using the second photoresist pattern as an etching mask to form the hard mask pattern.

18. The method of claim 15, further comprising:
forming a protection layer between the organic layer and the hard mask layer; and
forming a protection layer pattern by patterning the protection layer using the hard mask pattern as an etching mask.

19. A method of manufacturing a semiconductor device, comprising:
forming single crystalline pillars on a substrate;
forming gate insulation layers on sidewalls of the single crystalline pillars;
forming a gate electrode on the gate insulation layers to enclose the single crystalline pillars;
forming an insulation layer on the gate electrode;
forming impurity regions at upper portions of the single crystalline pillars;
forming a mold layer on the insulation layer and the impurity regions;
forming an organic layer on the mold layer;
forming a hard mask layer on the organic layer;
forming a preliminary hard mask pattern having first openings by patterning the hard mask layer;
forming a hard mask pattern having the first openings and second openings by patterning the preliminary hard mask pattern;
forming width control spacers on sidewalls of the first and the second openings;
forming an etching mask pattern by etching the organic layer using the hard mask pattern as an etching mask;

forming a mold layer pattern having third openings by etching the mold layer using the etching mask pattern as an etching mask, the third openings exposing the impurity regions;
forming lower electrodes on bottoms and sidewalls of the third openings;
forming a dielectric layer on the lower electrodes; and
forming an upper electrode on the dielectric layer.

20. The method of claim 19, wherein forming the width control spacers comprises:
forming a width control layer on the hard mask pattern, on sidewalls of the first and the second openings and on bottoms of the first and the second openings; and
anisotropically etching the width control layer.

* * * * *